United States Patent
Lee et al.

(10) Patent No.: US 11,721,673 B2
(45) Date of Patent: *Aug. 8, 2023

(54) SEMICONDUCTOR PACKAGE HAVING STACKED SEMICONDUCTOR CHIPS

(71) Applicant: SAMSUNG ELECTRONICS CO., LTD., Suwon-si (KR)

(72) Inventors: Hyuekjae Lee, Hwaseong-si (KR); Jihoon Kim, Asan-si (KR); Jihwan Suh, Cheonan-si (KR); Soyoun Lee, Hwaseong-si (KR); Jiseok Hong, Yongin-si (KR); Taehun Kim, Asan-si (KR); Jihwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,558

(22) Filed: Jan. 4, 2022

(65) Prior Publication Data

US 2022/0130801 A1    Apr. 28, 2022

Related U.S. Application Data

(63) Continuation of application No. 16/833,761, filed on Mar. 30, 2020, now Pat. No. 11,244,927.

(30) Foreign Application Priority Data

Jul. 25, 2019    (KR) .................... 10-2019-0089991

(51) Int. Cl.
*H01L 25/065* (2023.01)
*H01L 23/31* (2006.01)
(Continued)

(52) U.S. Cl.
CPC .......... *H01L 25/0657* (2013.01); *H01L 23/16* (2013.01); *H01L 23/31* (2013.01); *H01L 23/5386* (2013.01); *H01L 24/14* (2013.01)

(58) Field of Classification Search
CPC ..... H01L 25/0657; H01L 23/16; H01L 23/31; H01L 23/5386; H01L 24/14; H10B 80/00
See application file for complete search history.

(56) References Cited

U.S. PATENT DOCUMENTS

8,704,364 B2    4/2014 Banijamli
9,627,365 B1 *  4/2017 Yu ...................... H01L 27/2481
(Continued)

*Primary Examiner* — Timor Karimy
(74) *Attorney, Agent, or Firm* — Sughrue Mion, PLLC (57) ABSTRACT

Provided is a semiconductor package including a semiconductor stack including a first lower chip, a second lower chip, a gap filler disposed between the first lower chip and the second lower chip, and a first upper chip disposed on an upper surface of the first lower chip, an upper surface of the second lower chip, and an upper surface of the gap filler, the first lower chip includes first upper surface pads and a first upper surface dielectric layer, the second lower chip includes second upper surface pads and a second upper surface dielectric layer, the first upper chip includes lower surface pads and a lower surface dielectric layer, and an area of an upper surface of each of the second upper surface pads is greater than an area of a lower surface of each of the lower surface pads.

20 Claims, 11 Drawing Sheets

(51) Int. Cl.
  *H01L 23/16* (2006.01)
  *H01L 23/00* (2006.01)
  *H01L 23/538* (2006.01)

(56) References Cited

U.S. PATENT DOCUMENTS

| | | |
|---|---|---|
| 9,831,148 B2 | 11/2017 | Yu et al. |
| 9,966,360 B2 | 5/2018 | Yu et al. |
| 10,032,756 B2 | 7/2018 | Lin et al. |
| 11,244,927 B2 * | 2/2022 | Lee .................. H01L 25/50 |
| 2013/0200511 A1 | 8/2013 | Banijamli |
| 2017/0263518 A1 | 9/2017 | Yu et al. |
| 2018/0012863 A1 | 1/2018 | Yu et al. |
| 2019/0088581 A1 | 3/2019 | Yu et al. |
| 2019/0096866 A1 | 3/2019 | Hsu et al. |

* cited by examiner

SEMICONDUCTOR PACKAGE HAVING STACKED SEMICONDUCTOR CHIPS

CROSS-REFERENCE TO RELATED APPLICATION

This application is a continuation of U.S. application Ser. No. 16/833,761, filed on Mar. 30, 2020 in the U.S. Patent and Trademark Office, which claims priority from Korean Patent Application No. 10-2019-0089991, filed on Jul. 25, 2019, in the Korean Intellectual Property Office, the disclosures of which are incorporated herein by reference in their entirety.

BACKGROUND

1. Field

Example embodiments of the present disclosure relate to a semiconductor package including stacked semiconductor chips capable of reducing contact failure between semiconductor chips having fine pitches and capable of high-speed connection between mounted semiconductor chips.

2. Description of Related Art

As semiconductor devices become more highly integrated and have higher performance, semiconductor devices have a fine pitch, and high-speed connections between semiconductor chips are increasingly required. For a high-speed connection, the connection path needs to be short. In a related art method using a micro-bump, there is a limit to the shortening of the signal transmission path. If the semiconductor device has a fine pitch, the distance between the pads or the microbumps becomes small and when the semiconductor chips are stacked, even if the semiconductor chips are slightly misaligned from the correct position, a contact failure between the pads may occur. Therefore, it is necessary to develop a semiconductor package structure capable of reducing the contact failure between the pads having a fine pitch and capable of high-speed connection.

SUMMARY

According to an aspect of an example embodiment, there is provided a semiconductor package including a semiconductor stack including a first lower chip, a second lower chip disposed at a same level as the first lower chip, a gap filler disposed between the first lower chip and the second lower chip, and a first upper chip disposed on an upper surface of the first lower chip, an upper surface of the second lower chip, and an upper surface of the gap filler, wherein the first lower chip includes first upper surface pads and a first upper surface dielectric layer disposed at a same level and forming the upper surface of the first lower chip, wherein the second lower chip includes second upper surface pads and a second upper surface dielectric layer disposed at a same level and forming the upper surface of the second lower chip, wherein the first upper chip includes lower surface pads and a lower surface dielectric layer disposed at a same level and forming a lower surface of the first upper chip, and wherein an area of an upper surface of each of the second upper surface pads of the second lower chip is greater than an area of a lower surface of each of the lower surface pads of the first upper chip.

According to another aspect of an example embodiment, there is provided a semiconductor package including a semiconductor stack including a first lower chip, a second lower chip disposed at a same level as the first lower chip, a gap filler disposed between the first lower chip and the second lower chip, and a first upper chip disposed on an upper surface of the first lower chip, an upper surface of the second lower chip, and an upper surface of the gap filler, wherein the first lower chip includes first upper surface pads and a first upper surface dielectric layer disposed at a same level and forming the upper surface of the first lower chip, wherein the second lower chip includes second upper surface pads and a second upper surface dielectric layer disposed at a same level and forming the upper surface of the second lower chip, wherein at least one of the second upper surface pads of the second lower chip extends horizontally onto the upper surface of the gap filler, wherein the first upper chip includes lower surface pads and a lower surface dielectric layer disposed at a same level and forming a lower surface of the first upper chip, wherein at least one of the first upper surface pads of the first lower chip and at least one of the second upper surface pads of the second lower chip are directly bonded to the lower surface pads of the first upper chip, and wherein the lower surface dielectric layer of the first upper chip is directly bonded to the first upper surface dielectric layer of the first lower chip and the second upper surface dielectric layer of the second lower chip.

According to yet another aspect of an example embodiment, there is provided a semiconductor package including a package substrate, a semiconductor stack disposed on an upper surface of the package substrate, and a housing covering the semiconductor stack, wherein the semiconductor stack includes a first lower chip, a second lower chip disposed on a same level as the first lower chip, a gap filler disposed between the first lower chip and the second lower chip, and a first upper chip disposed on an upper surface of the first lower chip, an upper surface of the second lower chip, and an upper surface of the gap filler, wherein the first lower chip includes first upper surface pads and a first upper surface dielectric layer disposed at a same level and forming the upper surface of the first lower chip, wherein the second lower chip includes second upper surface pads and a second upper surface dielectric layer disposed at a same level and forming the upper surface of the second lower chip, wherein the gap filler includes gap pads and a gap upper dielectric layer, the gap pads and the gap upper dielectric layer being disposed on the upper surface of the gap filler, wherein the first upper chip includes lower surface pads and a lower surface dielectric layer disposed at a same level and forming a lower surface of the first upper chip, wherein an area of an upper surface of each of the first upper surface pads of the first lower chip is greater than an area of a lower surface of each of the lower surface pads of the first upper chip, wherein an area of an upper surface of each of the second upper surface pads of the second lower chip is greater than the area of the lower surface of each of the lower surface pads of the first upper chip, wherein portions of the first upper surface pads of the first lower chip and portions of the second upper surface pads of the second lower chip are directly bonded to the lower surface pads of the first upper chip, and wherein the lower surface dielectric layer of the first upper chip is directly bonded to the first upper surface dielectric layer of the first lower chip and the second upper surface dielectric layer of the second lower chip.

BRIEF DESCRIPTION OF THE DRAWINGS

The above and/or other objects and will become apparent by describing in detail example embodiments thereof with reference to the accompanying drawings, of which.

DETAILED DESCRIPTION

Figure 1:
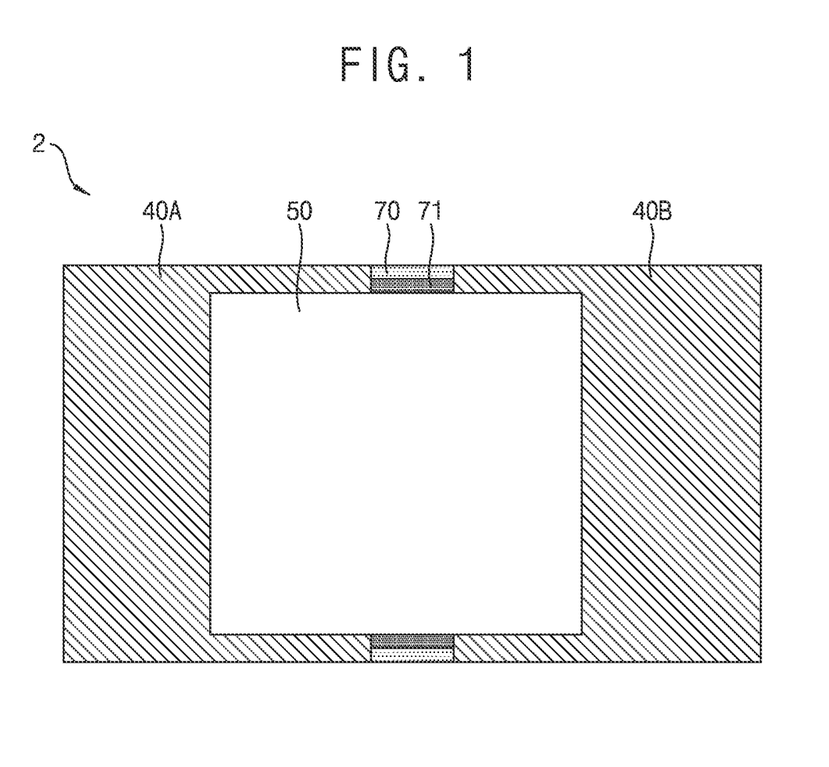
FIG. 1 is a top view of a semiconductor stack according to an example embodiment.

FIG. 1 is a top view of a semiconductor stack 2 according an example embodiment and FIGS. 2 to 7 are cross-sectional views of a semiconductor stack 2 according to example embodiments.

Figure 2:
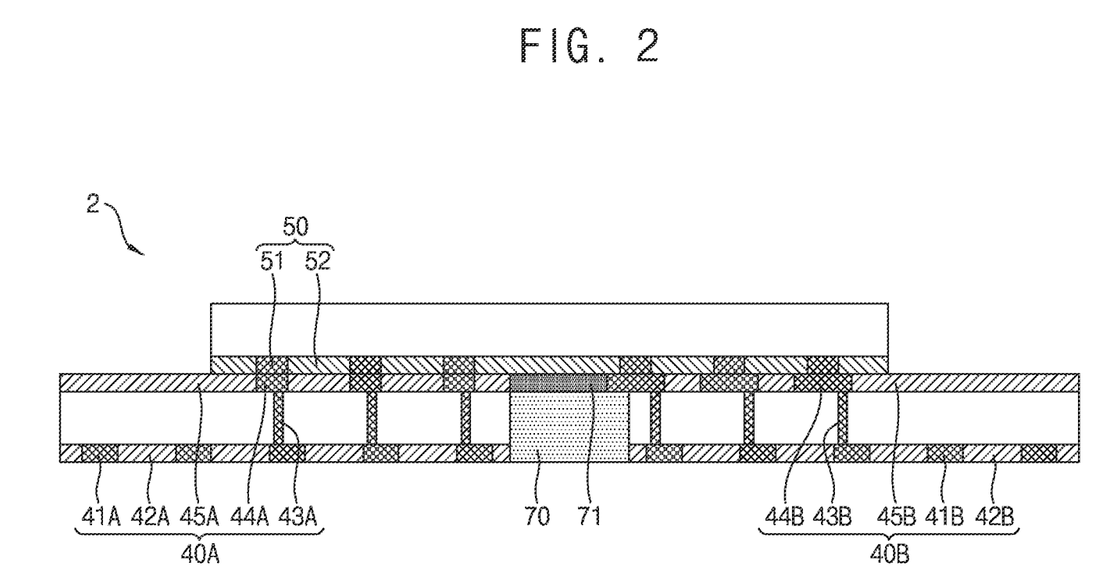
FIGS. 2, 3, 4, 5, 6, and 7 are cross-sectional views of a semiconductor stack according to example embodiments.

Referring to FIGS. 1 and 2, a semiconductor stack 2 according to an example embodiment includes a first lower chip 40A, a second lower chip 40B, an upper chip 50, and a gap filler 70. The first lower chip 40A and the second lower chip 40B may be disposed at the same level. The gap filler 70 may be disposed between the first lower chip 40A and the second lower chip 40B. The upper chip 50 may be disposed on the first lower chip 40A, the second lower chip 40B, and the gap filler 70. The first lower chip 40A may include a plurality of first upper surface pads 44A and an upper surface dielectric layer 45A disposed on the upper surface. The second lower chip 40B may include a plurality of second upper surface pads 44B and an upper surface dielectric layer 45B disposed on the upper surface. The upper chip 50 may include a plurality of lower surface pads 51 and a lower surface dielectric layer 52. The second upper surface pads 44B of the second lower chip 40B may be greater than the lower surface pads 51 of the upper chip 50. That is, an area of an upper surface of each of the second upper surface pads 44B of the second lower chip 40B may be greater than an area of a lower surface of each of the lower surface pads 51 of the upper chip 50.

In stacking semiconductor chips 40A, 40B, and 50 having relatively fine pitches, when stacking the upper chip 50 on the first lower chip 40A and the second lower chip 40B, contact failure may occur even when the arrangement is slightly misaligned. The contact failure may be reduced or prevented when the first upper surface pads 44A of the first lower chip 40A and the second upper surface pads 44B of the second lower chip 40B are greater than the lower surface pads 51 of the upper chip 50. In addition, contact failure may be reduced or prevented even when the gap between the first lower chip 40A and the second lower chip 40B becomes wider or narrower. For example, when the lower surface pads 51 of the upper chip 50 are preferentially aligned with the first upper surface pads 44A of the first lower chip 40A, the remaining lower surface pads 51 of the upper chip 50 may be in contact with the wider second upper surface pads 44B of the second lower chip 40B, and the contact failure between the semiconductor chips 40A, 40B, and 50 may be reduced or prevented.

At least one of the second upper surface pads 44B of the second lower chip 40B may extend horizontally onto the upper surface of the gap filler 70. Referring to FIG. 2, the second upper surface pad 44B of the second lower chip 40B closest to the gap filler 70 extends horizontally onto the gap filler 70. In this case, in the semiconductor chips 40A, 40B, and 50 having relatively fine pitches, the upper portion of the gap filler 70 between the first lower chip 40A and the second lower chip 40B may be utilized as the pad 44B region, and the second upper surface pads 44B of the second lower chip 40B may be further extended.

Figure 3:
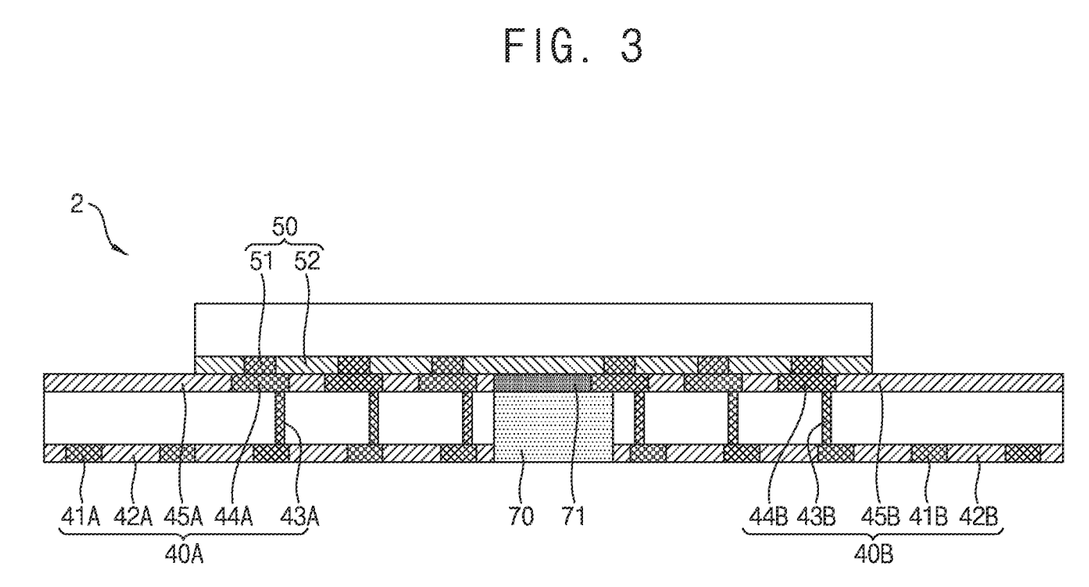

Referring to FIG. 3, the first upper surface pads 44A of the first lower chip 40A may be greater than the lower surface pads 51 of the upper chip 50. That is, an area of an upper surface of each of the first upper surface pads 44A of the first lower chip 40A may be greater than an area of a lower surface of each of the lower surface pads 51 of the upper chip 50. In this case, the contact failure between the semiconductor chips 40A, 40B, and 50 may be reduced even if the lower surface pads 51 of the upper chip 50 are not preferentially aligned with any of the first upper surface pads 44A or the second upper surface pads 44B.

Figure 4:
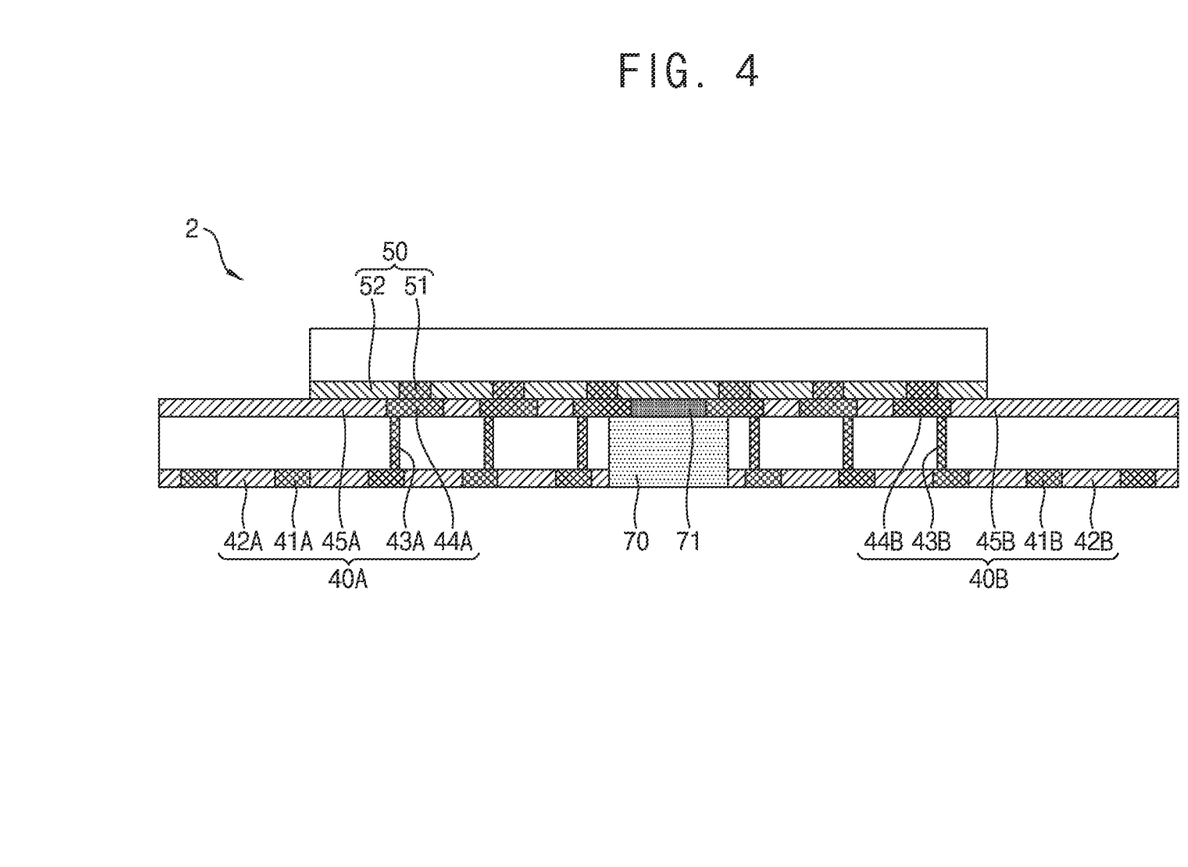

Referring to FIG. 4, at least one of the first upper surface pads 44A of the first lower chip 44A and at least one of the second upper surface pads 44B of the second lower chip 44B may extend horizontally onto the upper surface of the gap filler 70. In this case, the upper portion of the gap filler 70 between the first lower chip 40A and the second lower chip 40B may be utilized as a region where the first upper surface pads 44A and the second upper surface pads 44B are disposed.

Figure 5:
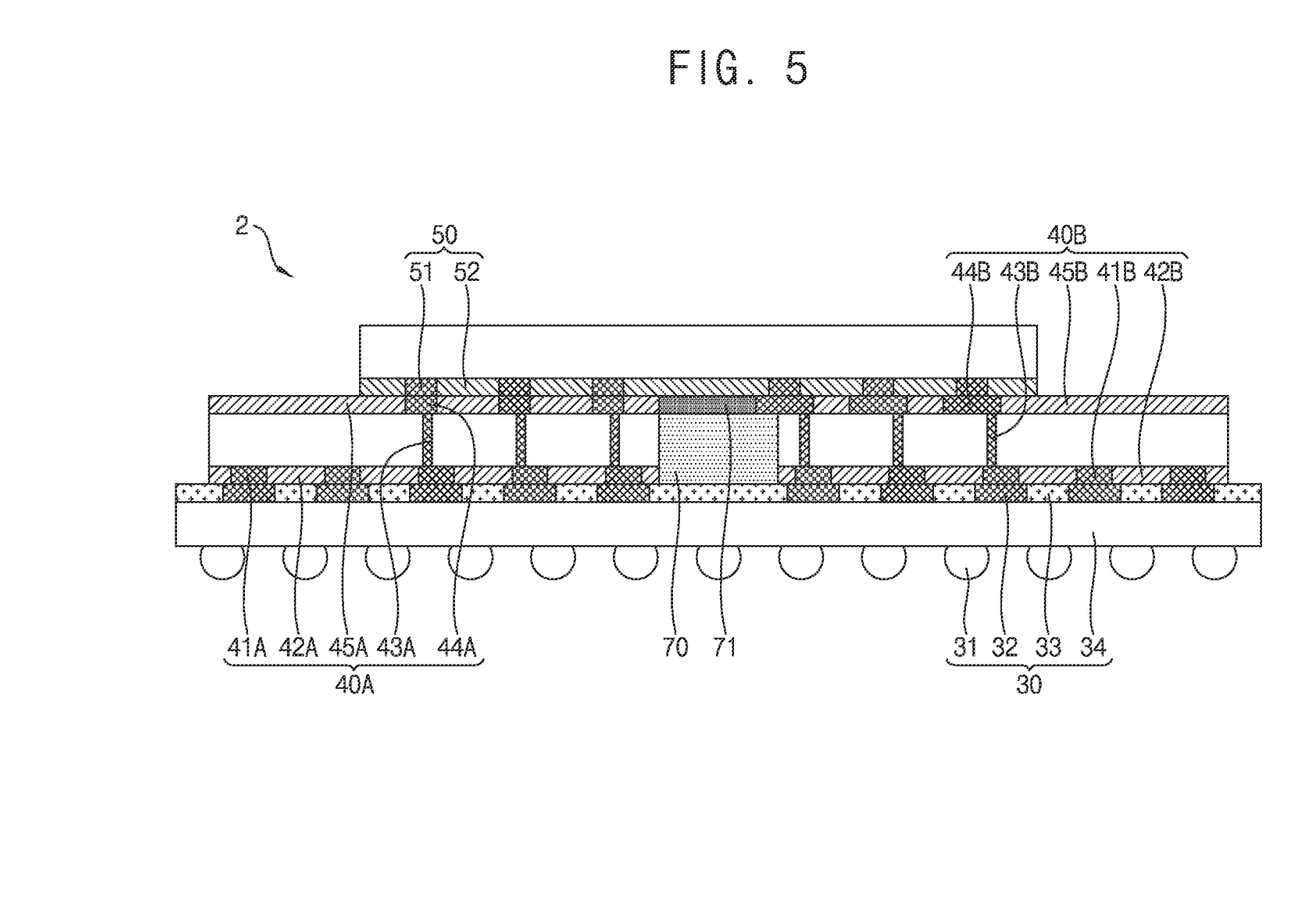
Figure 6:
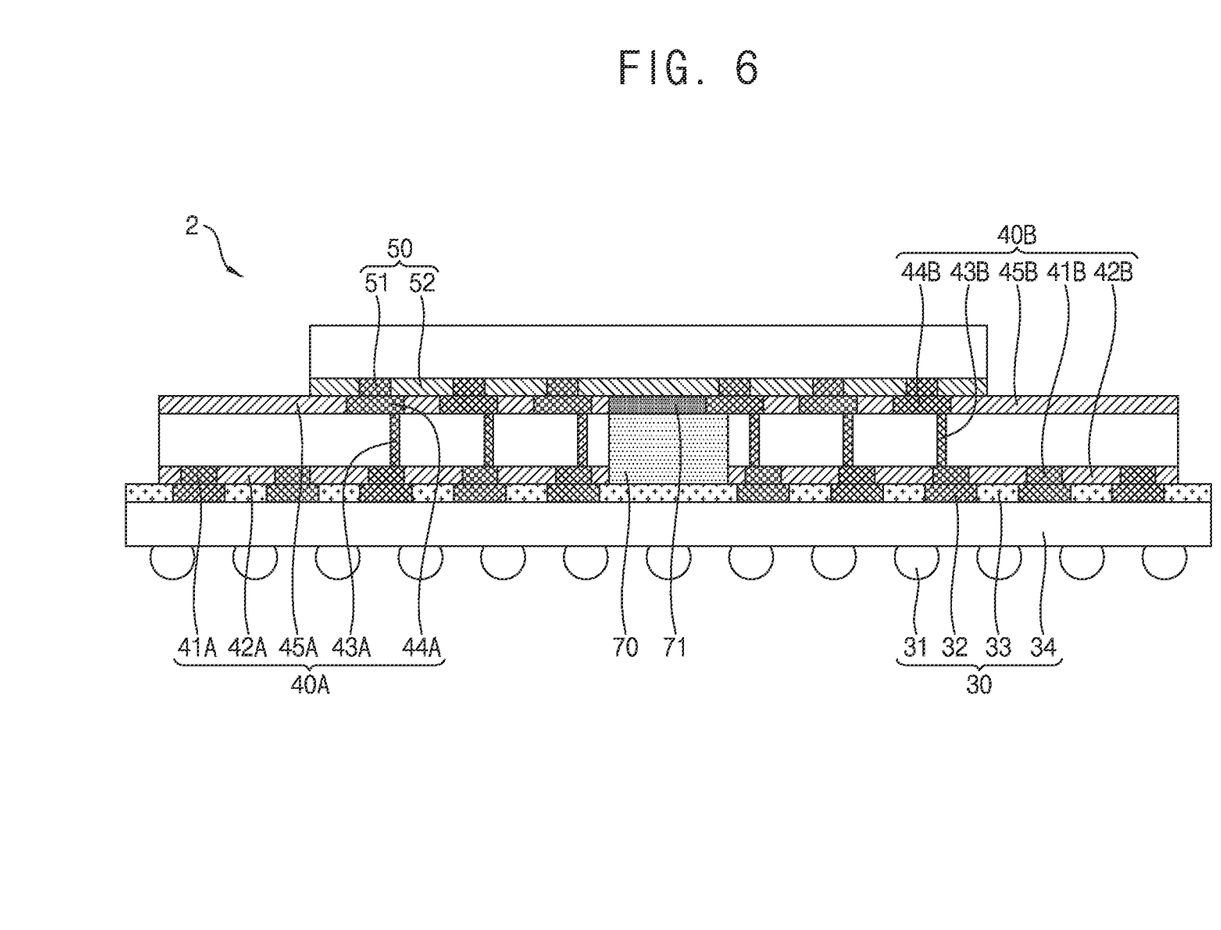
Figure 7:
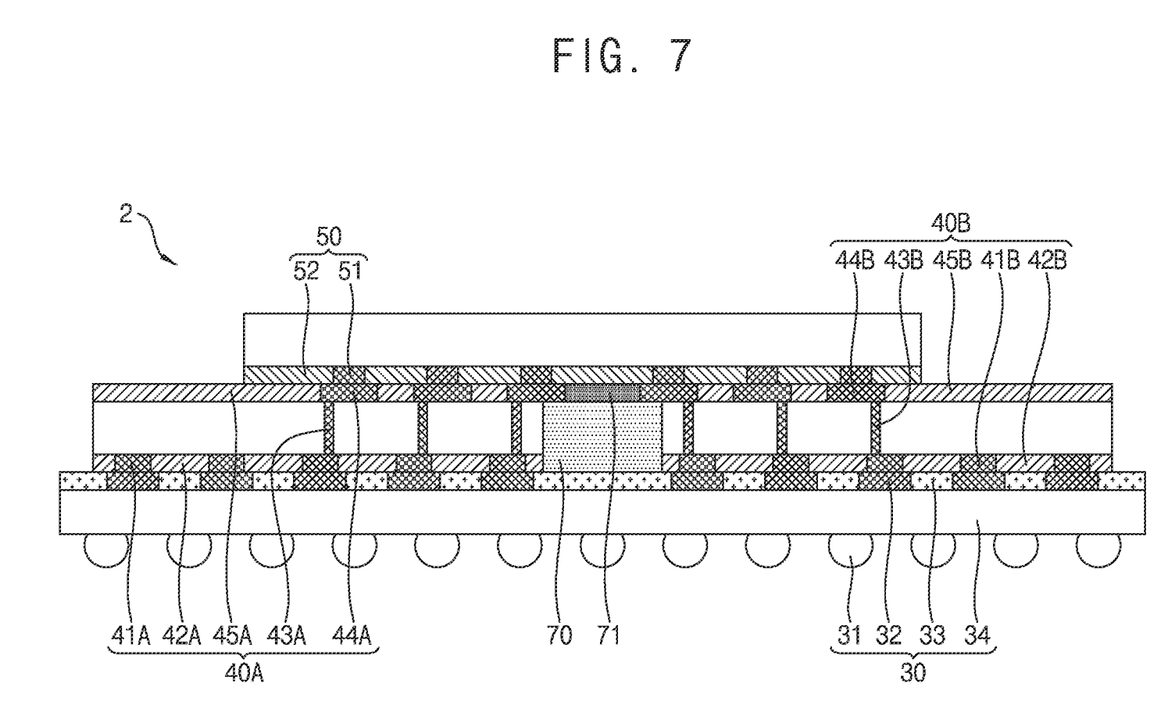

Referring to FIGS. 5, 6, and 7, the semiconductor stack 2 may further include an interposer 30 disposed under the first lower chip 40A, a second lower chip 40B, and a gap filler 70 that are disposed at the same level. The interposer 30 may include a material of silicon or glass. The interposer 30 may include a bump 31, an interposer pad 32, a dielectric layer 33, and an interposer circuit 34. The interposer 30 may include an upper surface and a lower surface. The upper surface of the interposer 30 is a surface on which the semiconductor stack 2 in which the semiconductor chips 40A, 40B, and 50 are stacked may be mounted. The upper surface of the interposer 30 is provided with interposer pads 32 for electrically connecting the interposer 30 and the semiconductor chips 40A, 40B and 50 and dielectric layer 33 for insulating the interposer pads 32 from each other. The lower surface of the interposer 30 may be the surface opposite to the upper surface. Bumps 31, such as solder balls, may be disposed on the lower surface of the interposer 30. An interposer circuit 34 such as a redistribution layer (RDL) may be disposed between the upper surface and the lower surface of the interposer 30.

Referring to FIG. 5, an area of the interposer pads 32 may be greater than an area of the lower surface pads 41A of the first lower chip 40A and an area of the lower surface pads 41B of the second lower chip 40B, respectively. If interposer pads 32 are greater than the first lower surface pads 41A of the first lower chip 40A and the second lower surface pads 41B of the second lower chip 40B, the contact failure may be reduced when the semiconductor chips 40A, 40B and 50 having fine pitches are stacked on the interposer 30.

The first upper surface pads 44A and the lower surface pads 41A of the first lower chip 40A may have the same area. A first via 43A may connect the first upper surface pads 44A and the first lower surface pads 41A. The second upper surface pads 44B and the lower surface pads 41B of the second lower chip 40B may have the same area. A second via 43B may connect the second upper surface pads 44B and the second lower surface pads 41B. In this case, in order to reduce the contact failure between the entire semiconductor chips 40A, 40B, and 50, the areas of the pads may be greater in the order of the interposer pads 32, pads 41A, 44A, 41B, and 44B having the same area, and the lower surface pads 51 of the first upper chip 50.

For example, as illustrated in FIGS. 6 and 7, an area of the first upper surface pads 44A of the first lower chip 40A may be greater than an area of the first lower surface pads 41A of the first lower chip 40A. Similarly, an area of the second upper surface pads 44B of the second lower chip 40B may be greater than an area of the second lower surface pads 41B of the second lower chip 40B.

Figure 8:
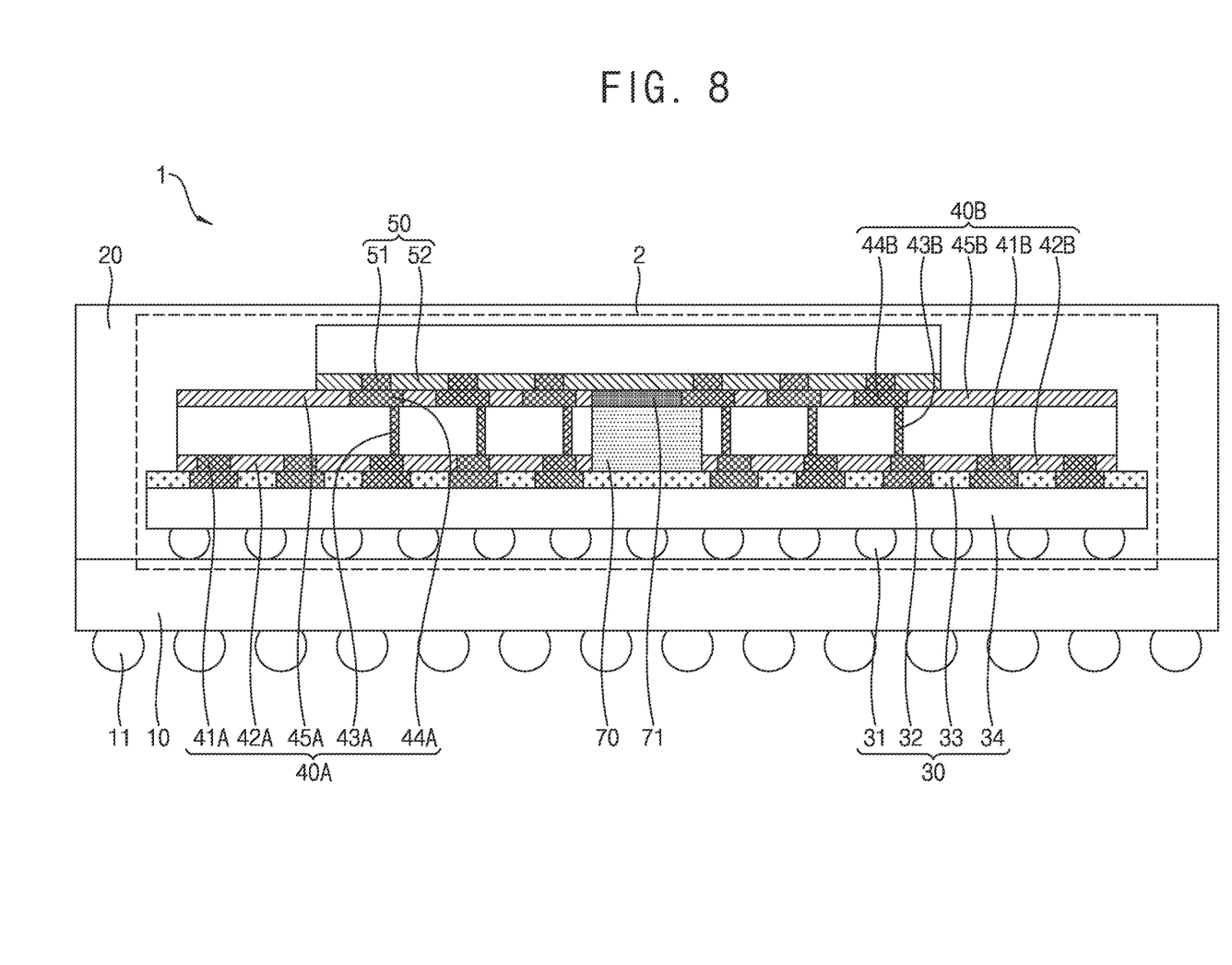
FIGS. 8 and 9 are cross-sectional views of a semiconductor package according to example embodiments.
Figure 9:
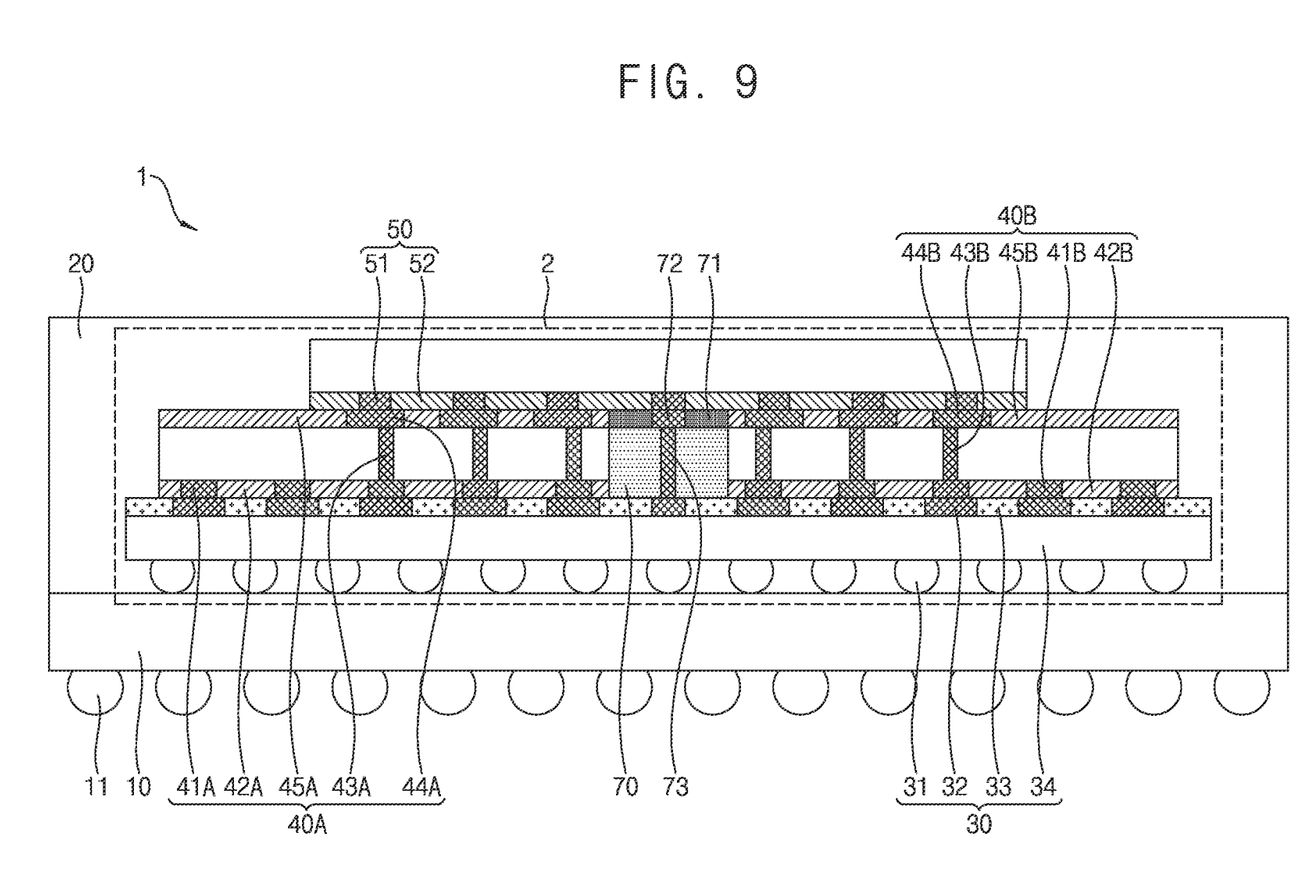

FIGS. 8 and 9 are cross-sectional views of a semiconductor package according to example embodiments. Referring to FIG. 8, a semiconductor package 1 may further include a package substrate 10, a semiconductor stack 2 mounted on the package substrate 10, and a housing 20 covering the semiconductor stack 2.

The package substrate 10 may include an upper surface and a lower surface. The semiconductor stack 2 may be disposed on the upper surface of the package substrate 10 and the bumps 11 such as solder balls may be disposed on the lower surface of the package substrate 10. The package substrate 10 may connect the semiconductor chips 40A, 40B, and 50 to an external circuit and may support and protect the semiconductor chips 40A, 40B, and 50 from external impacts. For example, the package substrate 10 may include a printed circuit board (PCB). In an example embodiment, the interposer 30 may be omitted. For example, the semiconductor stack 2 may be directly mounted on the package substrate 10.

The housing 20 may protect the semiconductor chips 40A, 40B, and 50 from the external environment and may be produced by a mold process. The housing 20 may include epoxy molding compound (EMC). In an example embodiment, the housing 20 may be omitted.

The bonding between the interposer 30 and the first lower chip 40A and the second lower chip 40B or the bonding between the first lower chip 40A and the second lower chip 40B and the upper chip 50 may be performed by hybrid bonding method. For example, metal-to-metal direct bonding may be performed between the contacting metals, and dielectric-to-dielectric direct bonding may be performed between the contacting dielectric layers. That is, a part of the first upper surface pads 44A of the first lower chip 40A and a part of the second upper surface pads 44B of the second lower chip 40B may be directly bonded to the lower surface pad 51 of the upper chip 50. The lower surface dielectric layer 52 of the upper chip 50 may be directly bonded to the upper surface dielectric layer 45A of the first lower chip 40A and the upper surface dielectric layer 45B of the second lower chip 40B.

The first lower surface pads 41A of the first lower chip 40A and the second lower surface pads 41B of the second lower chip 40B may be respectively directly bonded to the interposer pads 32. The first lower surface dielectric layers 42A of the first lower chip 40A and the second lower surface dielectric layers 42B of the second lower chip 40B may be directly bonded to the dielectric layer 33 of the interposer 30.

By a hybrid bonding method, conventional bumps and polymer layers may be removed, multistage stacks may be configured without vertically spaced spaces, the semiconductor package 1 may be reduced in thickness, and high-speed connections between the semiconductor chips 40A, 40B and 50 may be implemented. In the case of using the hybrid bonding method, there is no bump or the like to compensate for the difference in thickness between the first lower chip 40A and the second lower chip 40B. And the direct bonding between the pads facing each other such as the first upper surface pads 44A and the lower surface pad 51 or the second upper surface pads 44B and the lower surface pad 51 is required. The upper surfaces of the lower chips 40A and 40B may be planarized through a chemical mechanical polishing (CMP) process or the like before the upper chip 50 is stacked on the first lower chip 40A and the second lower chip 40B.

Referring to FIG. 9, a gap filler 70 disposed between the first lower chip 40A and the second lower chip 40B disposed at the same level, may include a plurality of gap pads 72 and a gap upper dielectric layer 71 disposed on the upper surface. Gap filler 70 may further include a gap via 73, and one end of is the gap via 73 may be in contact with one of the gap pads 72.

The gap filler 70 may include a dielectric such as a polymer or a resin. The gap upper dielectric layer 71 may include insulating material such as a polymer or a silicon oxide. The gap upper dielectric layer 71 may be coplanar with the upper surface dielectric layer 45A of the first lower chip 40A and the upper surface dielectric layer 45B of the second lower chip 40B, and may include the same material. The gap pads 72 may include copper as a conductive material. One end of the gap vias 73 may contact any one of the package substrate 10, the interposer pad 32, the first upper surface pads 44A of the first lower chip 40A and the second upper surface pads 44B of the second lower chip 40B, and the upper surface pads 54 of the upper chip 50.

The gap pads 72 may be directly metal-metal bonded to the corresponding lower surface pads 51 of the semiconductor chip 50 and the gap upper dielectric layer 71 may be directly bonded to the corresponding lower surface dielectric layer 52 of the semiconductor chip 50.

Figure 10:
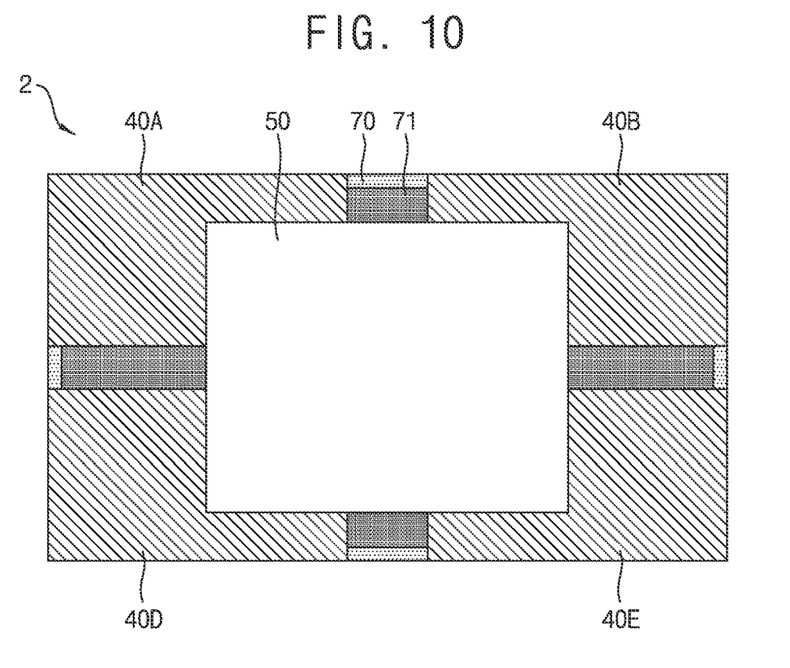
FIGS. 10 and 11 are top views of a semiconductor stack according to example embodiments.
Figure 11:
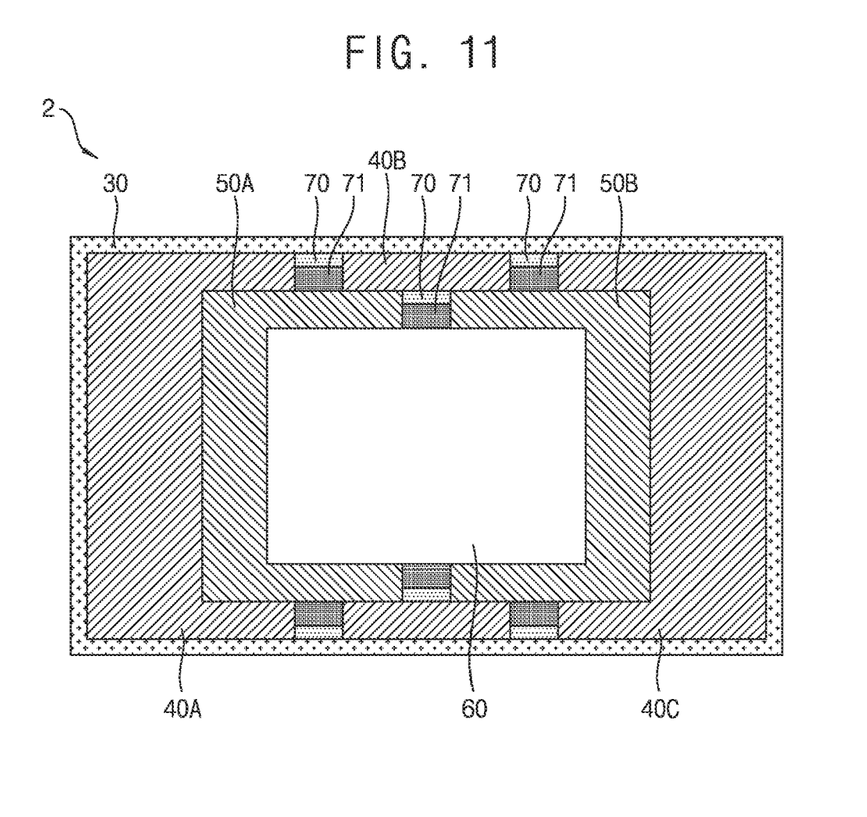
Figure 12:
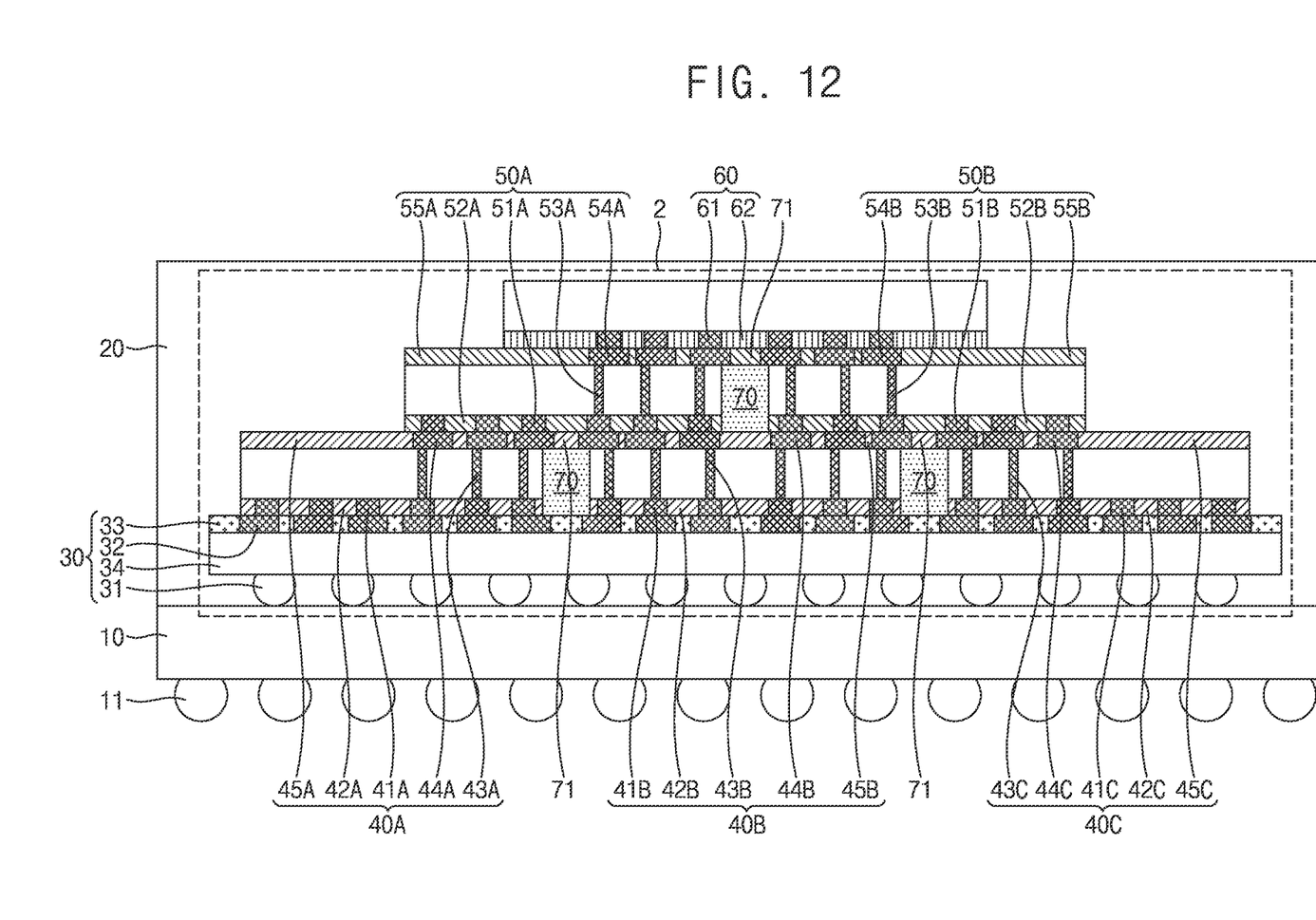
FIG. 12 is a cross-sectional view of a semiconductor package according to an example embodiment.

FIGS. 10 and 11 are top views of a semiconductor stack 2 according to example embodiments, and FIG. 12 is a cross-sectional view of a semiconductor package 1 according to an example embodiment. Referring to FIG. 10, the semiconductor stack 2 may further include a third lower chip 40D and a fourth lower chip 40E disposed at the same level as the first lower chip 40A and the second lower chip 40B. The upper chip 50 may cover a part of the third lower chip 40D and the fourth lower chip 40E. According to an example embodiment, at least one upper chip 50 may be stacked on the four lower chips 40A, 40B, 40D, and 40E. Gap fillers 70 may be disposed respectively between the first lower chip 40A, the second lower chip 40B, the third lower chip 40D, and the fourth lower chip 40E disposed at the same level.

Referring to FIG. 11, the semiconductor stack 2 may include first lower chip 40A, a second lower chip 40B, and a third lower chip 40C disposed at a same level, gap fillers 70 and first upper chip 50A and the second upper chip 50B. The gap fillers 70 may be disposed between the first lower chip 40A and the second lower chip 40B, and between the second lower chip 40B and the third lower chip 40C, respectively. The first upper chip 50A may be disposed on the first lower chip 40A, the second lower chip 40B, and the gap filler 70 between the first lower chip 40A and the second lower chip 40B. The second upper chip 50B may be disposed on the second lower chip 40B, the third lower chip 40C, and the gap filler 70 between the second lower chip 40B and the third lower chip 40C.

Referring to FIG. 12, the semiconductor stack 2 may further include a top floor chip 60 disposed on the first upper chip 50A, the second upper chip 50B and the gap filler 70 between the first upper chip 50A and the second upper chip 50B.

The first upper surface pads 44A of the first lower chip 40A, the second upper surface pads 44B of the second lower chip 40B, and third upper surface pads 44C of the third lower chip 40C may be greater than the first lower surface pads 51A of the first upper chip 50A and second lower surface pads 51B of the second upper chip 50B. The first upper surface pads 54A of the first upper chip 50A and the second upper surface pads 54B of the second upper chip 50B may be greater than the top floor lower surface pads 61 of the top floor chip 60. The interposer pads 32 of the interposer 30 may be greater than the first lower surface pads 41A of the first lower chip 40A, the second lower surface pads 41B of the second lower chip 40B, and the third lower surface pads 41C of the third lower chip 40C. At least each one of the first to third upper surface pads 44A, 44B, 44C of the first to third lower chips 40A, 40B, 40C and the first and second upper surface pads 54A and 54B of the first and second upper chips 50A and 50B, may extend horizontally onto the upper surface of the gap fillers 70.

In the semiconductor package 1, the bonding between the interposer 30 and the first lower chip 40A, the second lower chip 40B, and the third lower chip 40C, the bonding between the first lower chip 40A, the second lower chip 40B, and the third lower chip 40C and the first upper chip 50A and the second upper chip 50B, and the bonding between the first upper chip 50A and the second upper chip 50B and the top floor chip 60 may be the hybrid bonding. The contacting pads may be directly metal-to-metal bonded to each other, and contacting dielectric layers may be directly bonded to each other.

According to example embodiments, it is possible to reduce the contact failure when stacking semiconductor chips having relatively fine pitches by forming the upper surface pads of the lower chips to have an area greater than the lower surface pads of the upper chip. Space between the lower chips may be utilized by arranging at least one pad on the gap filler, and high-speed connection between semiconductor chips may be achieved by directly bonding the pads.

While the example embodiments have been described with reference to the accompanying drawings, those skilled in the art to which the disclosure pertains can understand that the disclosure may be implemented in other forms without departing from the technical spirit or the features of the disclosure. It may be understood that the above-described example embodiments are not limitative but illustrative in all aspects.

What is claimed is:
1. A semiconductor package comprising:
a semiconductor stack comprising:
a first lower chip;
a second lower chip disposed at a same level as the first lower chip;
a gap filler disposed between the first lower chip and the second lower chip; and
a first upper chip disposed on the first lower chip, the second lower chip and the gap filler,
wherein the first lower chip comprises a first upper surface pad and a first upper surface dielectric layer disposed on a same level and formed at an upper surface of the first lower chip, a first lower surface pad formed at a lower surface of the first lower chip and a first via connecting the first upper surface pad and the first lower surface pad,
wherein the second lower chip comprises a second upper surface pad and a second upper surface dielectric layer disposed on a same level and formed at an upper surface of the second lower chip, a second lower surface pad formed at a lower surface of the second lower chip, and a second via connecting the second upper surface pad and the second lower surface pad,
wherein the first upper chip comprises lower surface pads and lower surface dielectric layer disposed on a same level and formed at a lower surface of the first upper chip,
wherein the first upper surface pad and some of the lower surface pads are directly bonded,
wherein the second upper surface pad and some of the lower surface pads are directly bonded,
centers of the first lower surface pad, the first upper surface pad, and the first via are not vertically aligned with each other in a cross-sectional view, and
centers of the second lower surface pad, the second upper surface pad, and the second via are not vertically aligned with each other in the cross-sectional view.

2. The semiconductor package of claim 1, wherein the first upper surface dielectric layer and the lower surface dielectric layer are directly bonded, and
the second upper surface dielectric layer and the lower surface dielectric layer are directly bonded.

3. The semiconductor package of claim 1, wherein a center of the first lower surface pad is offset from the first via in a first direction, and a center of the first upper surface pad is offset from the first via in a second direction opposite to the first direction, in a cross-sectional view.

4. The semiconductor package of claim 1, wherein a center of the second lower surface pad is offset from the second via in a first direction, and a center of the second upper surface pad is offset from the second via in a second direction opposite to the first direction, in a cross-sectional view.

5. The semiconductor package of claim 1, wherein a size of the first upper surface pad and a size of the second upper surface pad are different from each other.

6. The semiconductor package of claim 1, wherein a size of the first upper surface pad and a size of the second upper surface pad are same each other.

7. The semiconductor package of claim 1, wherein the second upper surface pad is wider than one of the lower surface pads.

8. The semiconductor package of claim 1, wherein the semiconductor stack further comprises:
a gap via passing through the gap filler; and
a gap pad connected to the gap via, and
wherein the gap pad is connected to some of the lower surface pads.

9. A semiconductor package comprising:
a semiconductor stack comprising:
a first lower chip;
a second lower chip disposed at a same level as the first lower chip;
a gap filler disposed between the first lower chip and the second lower chip; and
a first upper chip disposed on the first lower chip, the second lower chip and the gap filler,
wherein the first lower chip comprises a first upper surface pad and a first upper surface dielectric layer disposed on a same level and formed at an upper surface of the first lower chip, a first lower surface pad formed at a lower surface of the first lower chip and a first via connecting the first upper surface pad and the first lower surface pad,
wherein the second lower chip comprises a second upper surface pad and a second upper surface dielectric layer disposed on a same level and formed at an upper surface of the second lower chip, a second lower surface pad formed at a lower surface of the second lower chip, and a second via connecting the second upper surface pad and the second lower surface pad, wherein the first upper chip comprises lower surface pads and lower surface dielectric layer disposed on a same level and formed at a lower surface of the first upper chip, wherein the first upper surface pad and some of the lower surface pads are directly bonded, wherein the second upper surface pad and some of the lower surface pads are directly bonded, and wherein a center of the second lower surface pad is offset from the second via in a first direction, and a center of the second upper surface pad is offset from the second via in a second direction opposite to the first direction, in a cross-sectional view.

10. The semiconductor package of claim 9, wherein a center of the first lower surface pad is offset from the first via in the second direction, and a center of the first upper surface pad is offset from the first via in the second direction, in the cross-sectional view.

11. The semiconductor package of claim 9, wherein centers of the first lower surface pad, the first upper surface pad, and the first via are not vertically aligned with each other.

12. The semiconductor package of claim 9, wherein a center of the first lower surface pad is offset from the first via in the second direction, and a center of the first upper surface pad is offset from the first via in the first direction, in the cross-sectional view.

13. The semiconductor package of claim 9, wherein the first upper surface dielectric layer and the lower surface dielectric layer are directly bonded, and the second upper surface dielectric layer and the lower surface dielectric layer are directly bonded.

14. The semiconductor package of claim 9, wherein the first upper surface pad is wider than the first lower surface pad.

15. The semiconductor package of claim 9, wherein the second upper surface pad is wider than the second lower surface pad.

16. The semiconductor package of claim 9, wherein the semiconductor stack further comprising:

a gap upper dielectric layer on the gap filler, wherein the gap upper dielectric layer exposes an upper surface of the gap filler, and wherein the second upper surface pad extends horizontally on the gap filler and is in contact with the gap upper dielectric layer.

17. The semiconductor package of claim 16, wherein the first upper surface pad extends horizontally on the gap filler and is in contact with the gap upper dielectric layer.

18. The semiconductor package of claim 9, wherein the semiconductor stack further comprises:

a gap via passing through the gap filler; and a gap pad connected to the gap via, and wherein the gap pad is connected to some of the lower surface pads.

19. A semiconductor package comprising:

a package substrate;

an interposer on the package substrate; and a semiconductor stack, wherein the interposer comprises interposer pads formed on an upper surface of interposer;

wherein the semiconductor stack comprises:

a first lower chip;

a second lower chip disposed at a same level as the first lower chip;

a gap filler disposed between the first lower chip and the second lower chip; and a first upper chip disposed on the first lower chip, the second lower chip and the gap filler, wherein the first lower chip comprises first upper surface pads and a first upper surface dielectric layer disposed on a same level and formed at an upper surface of the first lower chip, first lower surface pads formed at a lower surface of the first lower chip and first vias connecting the first upper surface pads and the first lower surface pads, wherein the second lower chip comprises second upper surface pads and a second upper surface dielectric layer disposed on a same level and formed at an upper surface of the second lower chip, second lower surface pads formed at a lower surface of the second lower chip, and second vias connecting the second upper surface pads and the second lower surface pads, wherein the first upper chip comprises lower surface pads and lower surface dielectric layer disposed on a same level and formed at a lower surface of the first upper chip, wherein the first upper surface pads and some of the lower surface pads are directly bonded, wherein the second upper surface pads and some of the lower surface pads are directly bonded, wherein the first lower surface pads and some of the interposer pads are directly bonded, wherein the second lower surface pads and some of the interposer pads are directly bonded, wherein the interposer pads are wider than the first lower surface pads, centers of some of the lower surface pads and the centers of some of the interposer pads are vertically aligned with each other, and centers of other of the lower surface pads and centers of other of the interposer pads are not vertically aligned with each other, one side surfaces of the other of the lower surface pads and one side surface of the other of the interposer pads are vertically aligned with each other.

20. The semiconductor package of claim 19, wherein the other of the lower surface pads and the other of the interposer pads are located at edge of the first lower chip, and the some of the lower surface pads and the some of the interposer pads are located at center of the first lower chip.

* * * * *